United States Patent
Werner et al.

(10) Patent No.: US 6,219,248 B1
(45) Date of Patent: Apr. 17, 2001

(54) HEAT SINK ALIGNMENT APPARATUS AND METHOD

(75) Inventors: Paul L. Werner; Martha V. Phipps, both of Rowlett, TX (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/298,373

(22) Filed: Apr. 23, 1999

(51) Int. Cl.[7] .................................................. H05K 7/20
(52) U.S. Cl. .......................... 361/719; 248/27.1; 361/704
(58) Field of Search ..................... 165/80.3, 185; 124/16.3; 248/27.1; 361/668, 704, 707–713, 717–719, 807, 809, 810, 812, 825

(56) References Cited

U.S. PATENT DOCUMENTS 5,579,205  *  11/1996  Tustaniwskyj .
5,598,322  *  1/1997  Von Arx .
5,708,564  *  1/1998  Lin .
5,991,154  *  11/1999  Clemens .
6,075,699  *  6/2000  Rife .

* cited by examiner

Primary Examiner—Gerald Tolin

(57) ABSTRACT

The present invention provides a heat sink mounting apparatus for mounting a heat transfer device to an electronic substrate. In one embodiment, the present invention provides for a dielectric strip having a longitudinal axis and opposing first and second sides, with the second side abutting the substrate when the heat sink mounting apparatus is mounted on a substrate. The heat sink mounting apparatus has a series of resilient planar fingers that are disposed on, and extend approximately normal to, the first side of the strip, which fingers are configured to removably engage a thermal transfer device. Notches on the fingers releasably secure the thermal transfer device to the heat sink mounting apparatus.

21 Claims, 4 Drawing Sheets

HEAT SINK ALIGNMENT APPARATUS AND METHOD

TECHNICAL FIELD OF THE INVENTION

The present invention is directed, in general, to a heat sink mounting apparatus and, more specifically, to an apparatus for attaching a heat sink to a substrate and a method of attachment.

BACKGROUND OF THE INVENTION

Electronic circuit designers have traditionally been concerned about controlling the heat that builds up during circuit operation. Heat control is vital to prevent individual component failure as well as a consequent circuit failure caused by failed components. The preferred method to control component and circuit heat is to dissipate excess heat into the atmosphere before the temperatures rise to a level where damage can occur. Heat dissipation is usually accomplished by associating heat transfer devices, such as heat sinks, with the components to absorb the component heat and radiate excess heat into the surrounding atmosphere.

The problems associated with heat control have become more pronounced as low profile and compact electronic systems have become the preferred choice of customers. These low profile and compact systems typically have design parameters that make it difficult to find space for all the required electronic components on the substrate of a printed wiring or circuit board, much less the heat transfer devices such components require to prevent heat related damage. For example, the specifications for a certain electronic system may call for a printed wiring or circuit board of no more than 125 square inches with a component height that cannot exceed 1.24 inches. Within this limited space, approximately 1700 electronic components must be accommodated, as well as the associated heat transfer devices necessary to remove over 100 watts of heat generated by the components.

Compact electronic systems also present additional manufacturing challenges. Limited component space means that specialized tooling may be required to assemble the heat transfer devices and their related components to the substrate. If specialized tooling is required, such tooling may have to be specially fabricated with a corresponding increase in the total production cost. In addition to specialized tooling, the manufacturing process often requires that the components be put together off the regular assembly line as sub-assemblies. When subassemblies are manufactured off line, additional handling problems must be addressed. Frequently, device leads have been inadvertently bumped or bent out of position between the time the assembly was built and when it is to be inserted in the substrate. When this happens, the operator must manually keep adjusting the device leads without the aid of the fixtures and jigs. Other problems include slowing the line down to accommodate such interruptions and the logistics of keeping track of parts, assemblies and subassemblies during the manufacturing process.

A number of the problems discussed above occur because heat transfer devices and mounts for such devices are not generally available on the commercial market for use in low profile and compact electronic assemblies. In fact, very few of the commercially available heat transfer devices are suitable for heat control when a large number of electronic components are required to be located in a restricted space. Most of the commercially available heat transfer devices are designed to accommodate only one or two electronic components, which means that several such devices are required to control the heat generated by a single circuit. Several heat transfer devices may be used in electronic systems where space is not a factor, but such is not acceptable in compact or low profile systems where space is at a premium.

In many cases where space is at a premium, the electronic components are mounted on heat spreaders and the spreaders are mounted on the substrate or printed wiring board with threaded studs and nuts. These spreaders frequently must be custom made when low profile or compact systems are manufactured. Such spreaders are frequently associated or combined with commercially available heat sinks to complete a heat control system. The use of spreaders on printed wiring or circuit boards typically means more and smaller parts are required. This is because the devices are usually fastened to the spreader with clamps, screws and nuts. Then the spreader assembly must be attached to both the substrate, as well as to other heat diffusing devices, which generally slows down the manufacturing process. Other heat diffusing devices are required because the spreaders, by themselves, do not have enough surface area to be effective as a stand-alone heat dissipating devices. Spreaders generally must be combined with a customized heat plate to increase the surface area.

Accordingly, what is needed in the art is a device and method that can be used to mount heat transfer devices and the associated electronic components on a substrate. The device should advantageously handle both spreaders and other heat transfer devices and provide for a completed electrical connection between the electronic components and the underlying circuit. Specifically, such a device should lend itself to being used in the manufacture of compact and low profile electronic systems.

SUMMARY OF THE INVENTION

To address the above-discussed deficiencies of the prior art, the present invention provides, a heat sink mounting apparatus for use in coupling an electronic component substrate to a thermal transfer device. The present invention provides for a dielectric strip having a longitudinal axis and opposing first and second sides, with the second side abutting the substrate when the heat sink mounting apparatus is mounted on a substrate. The heat sink mounting apparatus has a series of resilient planar fingers that are disposed on, and extend approximately normal to, the first side of the strip, which fingers are configured to removably engage a thermal transfer device. Notches on the fingers releasably secure the thermal transfer device to the heat sink mounting apparatus.

The present invention broadly introduces a device that can be used to mount heat sinks, other heat transfer devices, and spreaders to an electronic substrate. Such a device can be used to particular advantage in the manufacture and assembly of low profile electronics. In a particular advantageous embodiment, the heat transfer device described in copending U.S. patent application Ser. No. 09/298,427, entitled "Heat Sink Attachment Apparatus and Method," jointly assigned with the present invention and incorporated herein by reference can be used in combination with the invention to manufacture and assemble low profile electronics.

In one embodiment of the invention the device has a resilient latch finger extending approximately normal from the second side and configured to releasably secure the dielectric strip to a substrate. A further refinement calls for a pair of latch fingers on the second side, configured to cooperatively secure the dielectric strip to the substrate.

A particularly advantageous embodiment of the invention has a guide receptacle on the dielectric strip that is configured to direct the electrical leads on the electronic components mounted on the thermal transfer device to corresponding electrical connections on the substrate. In another alternative, a separate guide receptacle is provided for each electrical lead on the electronic component. In one embodiment a break-a-way is inscribed on the dielectric strip between the guide receptacle and the dielectric strip to permit removal of the guide receptacle when it is not needed. In one embodiment of the invention the dielectric strip has an orifice to receive a fastener to secure the dielectric strip to the substrate.

The present invention also provides for a method of manufacturing a heat sink mounting apparatus. One embodiment of the method calls for the formation of a dielectric strip having a longitudinal axis and opposing first and second sides configured so that the second side abuts a substrate when the heat sink mounting apparatus is mounted. Formed on the first side of the strip are a series of resilient planar fingers, which fingers are approximately normal to the first side and configured to removably engage a thermal transfer device. Notches are formed on the fingers that releasably secure the thermal transfer device to the heat sink mounting apparatus.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1A:
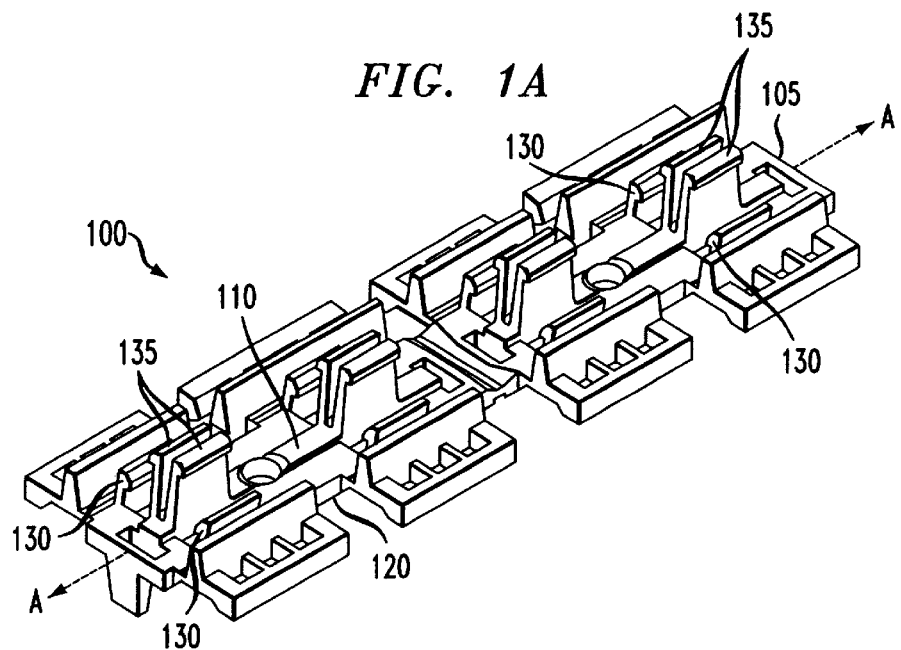
FIG. 1A illustrates an isometric view of a heat sink mounting apparatus constructed according to the principles of the present invention.

Referring initially to FIG. 1A, illustrated is an isometric view of a heat sink mounting apparatus 100 constructed according to the principles of the present invention. The illustrated mounting apparatus 100 incorporates several favorable embodiments of the present invention. The mounting apparatus 100 consists of a dielectric strip 105 having a longitudinal axis A—A with an opposing first side 110 and second side 120. When mounted on an electronic component substrate (not shown), the second side 120 of the mounting apparatus 100 abuts the substrate.

Figure 1B:
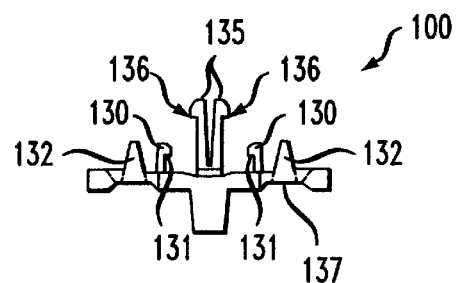
FIG. 1B illustrates an elevational end view of the heat sink mounting apparatus illustrated in FIG. 1A.

Disposed on the first side 110 of the dielectric strip 105 are a series of resilient planar fingers 130, 135 extending approximately normal to the first side 110. The elevational end view of the heat sink mounting apparatus 100 illustrated in FIG. 1B, clearly shows the resilient planar fingers 130, 135, with the center, or interior, planar fingers 135 being longer than the outer, or exterior, fingers 130 in this embodiment. The fingers 130, 135 are configured to releasably engage a thermal transfer device, such as a heat sink. At the end of each finger 130, 135 is a notch 131, 136 that releasably secures the thermal transfer device to the mounting apparatus 100. FIG. 1B also illustrates the end view of a recess 137 running the length of the second side 120 of the apparatus 100. This recess 137 also runs longitudinally along the entire length of apparatus 100, everywhere there are devices supported on the substrate to which it is fastened. This recess 137 permits cleaning fluids and solvents to run under apparatus 100 to remove debris and other foreign matter that may accumulate around the apparatus 100 and allows space for a solder fillet to be formed on that side of the component leads 171 and 181.

Figure 1C:
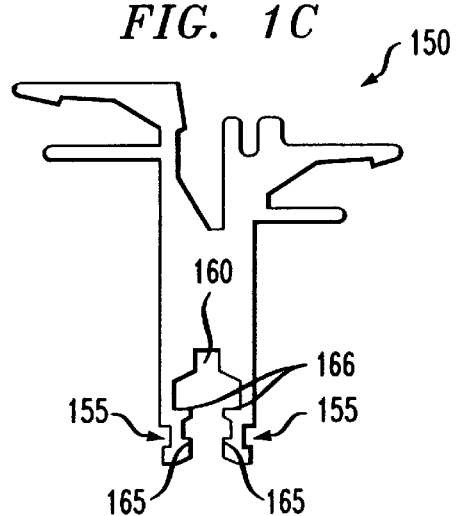
FIG. 1C illustrates an elevational end view of a heat transfer device of the type that can be mounted on the heat sink mounting apparatus illustrated in FIGS. 1A and 1B.

At this time, the best mode for using the invention illustrated and described herein is to combine it with the heat transfer device described in the aforementioned copending U.S. Ser. No. [Attorney Docket No. WERNER 1]. FIG. 1C illustrates an elevational end view of the heat transfer device 150 described therein.

FIG. 1B in conjunction with FIG. 1C can be used to describe how the planar fingers 130, 135 are used to mount the heat transfer device 150 and how the notches 131, 136 at the end of such fingers 130, 135 secure the device 150 to the mounting apparatus 100. Turning first to FIG. 1C, the heat transfer device 150 has a mounting receptacle 160 that runs longitudinally through the entire length of the device 150. The heat transfer device 150 is mounted on the heat sink mounting apparatus 100 by first locating the heat transfer device 150 over the heat sink mounting apparatus 100 in a position so the center planar fingers 135 on the apparatus 100 can be inserted into the mounting receptacle 160. As the heat transfer device 150 is pressed down on the planar fingers 135, the notches 136 at the ends of such fingers 135 engage longitudinal grooves 165 running along the lower sides of the mounting receptacle 160.

Figure 1D:
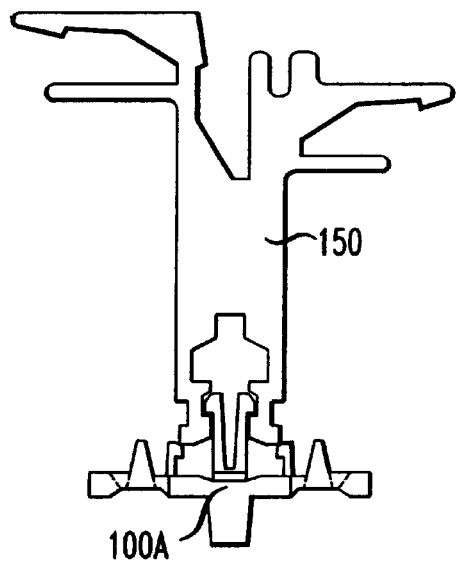
FIG. 1D illustrates the first of two positions in mounting the heat transfer device illustrated in FIG. 1C on the heat sink mounting apparatus illustrated in FIGS. 1A and 1B.
Figure 1E:
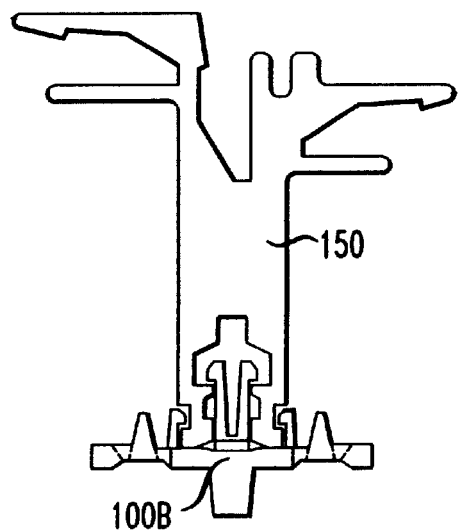
FIG. 1E illustrates the second of two positions in mounting the heat transfer device illustrated in FIG. 1C on the heat sink mounting,apparatus illustrated in FIGS. 1A and 1B.

Turning to FIGS. 1D and 1E, illustrated are elevational end views of the heat transfer device 150 as it is being mounted on the heat sink mounting apparatus 100. FIG. 1D illustrates the first, or partially mounted, position of the heat transfer device 150 as it is being installed on the mounting apparatus 100A and FIG. 1E illustrates the second, or fully installed, position. As described thus far, the heat transfer device 150 is partially mounted in position 100A. When in this partially mounted position, assembly personnel have additional room to install and work on components and perform other assembly tasks. The heat transfer device 150 can also be easily removed if necessary.

When assembly personnel are ready to install the heat transfer device 150 in its fully mounted position 100B, pressure is applied to the top of the device 150. The pressure causes the notches 136 at the end of the fingers 135 to be released from the first groove 165 as the device is pressed into a fully mounted position 100B. When fully mounted 100B, the notches 136 at the ends of the center fingers 135 engage ledges 166 inside the mounting receptacle 160 and the notches at the ends of the exterior planar fingers 130 engage exterior grooves 155 that run longitudinally along the base of the heat transfer device 150. It is clear how the fingers 130, 135 work cooperatively to hold the heat transfer device 150 in place and how the notches 131, 136 secure the device 150 to the mounting apparatus 100.

Figure 1F:
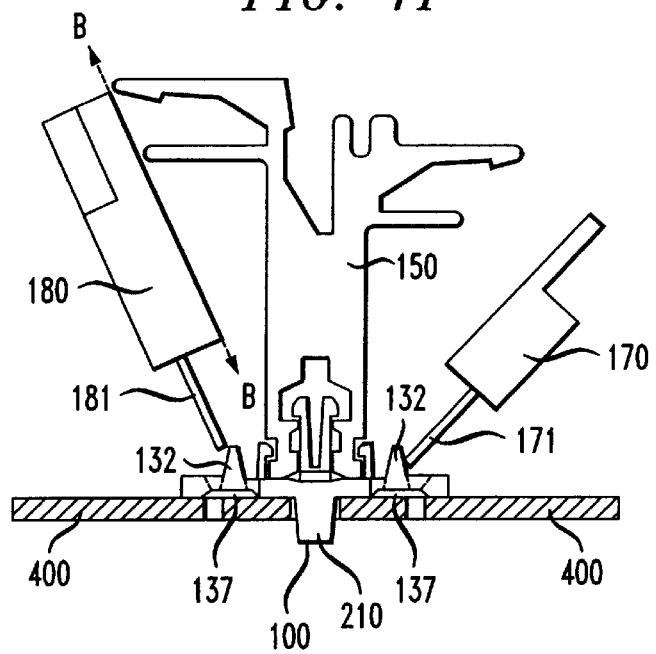
FIG. 1F illustrates an elevational end view of a heat transfer device mounted on the heat sink mounting apparatus and certain features of the mounting apparatus that aid in the fastening of electronic components to the heat transfer device.
Figure 1G:
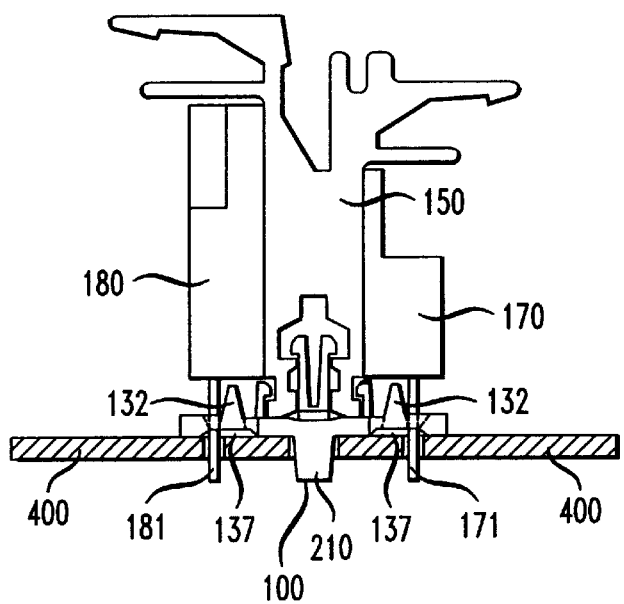
FIG. 1G illustrates an elevational end view of a heat transfer device mounted on the heat sink mounting apparatus with electronic components mounted on the heat transfer device.

Turning now to FIGS. 1F and 1G, illustrated is an additional feature that can be incorporated in an embodiment of the invention to ease the assembly process. Referring first to FIG. 1F, as an electronic component 180 is being installed and guided into position along the B—B line by the heat transfer device 150, the leads 181 of the component 180 meet the guide support 132 molded into the mounting apparatus 100. The guide support 132 guides the component leads 181 into receptacles 321 and 322 (see FIG. 3A) positioned to receive such leads 181. FIG. 1G illustrates the components 170, 180 in a fully installed position. When fully installed, the guide support 132 provides additional support for the component 170, 180 and also keeps the component in the correct position for the installation of the device clips (not shown).

Those skilled in the art readily recognize that, in broad scope, the illustrated mounting apparatus 100 introduces a device that can be used to mount heat sinks, heat spreaders, and other heat transfer devices to an electronic substrate. The invention describes a mounting apparatus 100 that is particularly useful in the manufacture and assembly of compact and low profile electronic systems. The apparatus 100 is useful for such applications because it permits heat sinks and spreaders holding multiple electronic components to be easily mounted on an electronic component substrate using a minimum number of parts.

Figure 2:
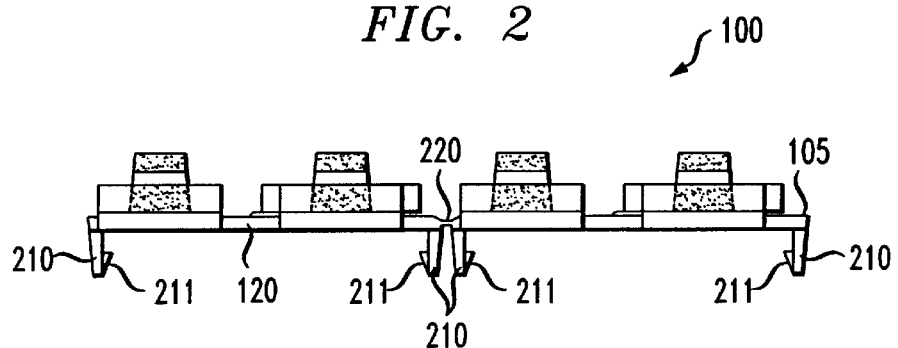
FIG. 2 illustrates an elevational side view of the heat sink mounting apparatus illustrated in FIG. 1A and the latch fingers used to mount the apparatus to an electronic substrate.

Turning now to FIG. 2, illustrated is a elevational side view of the heat sink mounting apparatus 100 illustrated in FIG. 1A. In this view, a particularly beneficial embodiment of the invention is illustrated that permits the heat sink mounting apparatus 100 to be mounted on a substrate. Extending approximately normal from, and disposed on, the second side 120 are latch fingers 210 configured to releasably secure the mounting apparatus 100 to a substrate (not shown) that has corresponding holes to receive the latch fingers 210. Located at the end of each latch finger 210 is a notch 211 that engages and secures the mounting apparatus 100 to the substrate. In one embodiment, a pair of latch fingers 210 are provided with notches 211 at the end configured to cooperatively engage the substrate by, in this case, having two opposing notches 211. Because the latch fingers 210 are resilient, if the mounting apparatus 100 must be removed from the substrate, a screwdriver or similar tool can be used to pry the mounting apparatus 100 off the substrate.

Figure 3A:
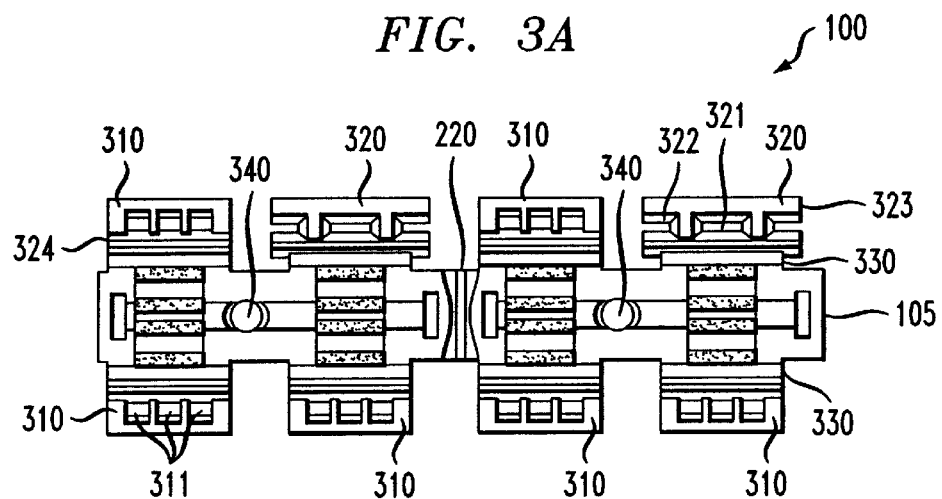
FIG. 3A illustrates a plan view of the top of the heat sink mounting apparatus illustrated in FIG. 1A showing guide receptacles to guide leads on electronic components to corresponding electrical connections on a substrate.
Figure 3B:
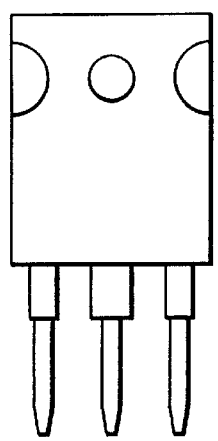
FIGS. 3B and 3C illustrate two different sizes of electronic components with electrical leads that can be installed on a substrate circuit in cooperation with the guide receptacles illustrated in FIG. 3A.
Figure 3C:
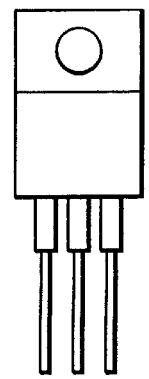

Turning now to FIG. 3A, illustrated is a top plan view of the heat sink mounting apparatus 100 of FIG. 1A. In a particularly advantageous embodiment of the invention, the dielectric strip 105 has guide receptacles 310, 320 configured to guide electrical leads on electronic components to corresponding electrical connections on the substrate. The illustrated mounting apparatus 100 has guide receptacles 310, 320 for two different sizes or types of electronic components. One type of guide receptacle 310 provides individual electrical lead guide slots 311 for the leads on a TO-220 type of electronic component, illustrated in FIG. 3C. The other type of guide receptacle 320 provides an electrical lead guide slot 321 for the center lead of the larger TO-247 electronic component, illustrated in FIG. 3B, with the outer two electrical leads guided into position by a beveled edge 322 and an extended guide bar 323 on each side of the receptacle 320. If the guide receptacles 310, 320 are not needed, a break-a-way groove 330 is molded into the dielectric strip 105 that permits unneeded guide receptacles 310, 320 to be removed. This feature can also be used for alternative mounting arrangements for other devices.

FIG. 3A also illustrates an embodiment of the invention that permits the mounting apparatus 100 to be mounted on a substrate using conventional fastening devices. Orifices 340 are provided on the strip 105 that permits the use of bolts, screws, pins or other fastening devices to secure the strip 105 to an electronic substrate. The beveled holes 340 can also serve to align the apparatus 100 to a heat transfer device 150 as it is mounted thereon.

Illustrated in FIGS. 2 and 3A are break-a-way grooves 220 that permit the strip 105 to be divided into segments. The illustrated strips 105 can be divided into two segments, but those skilled in the art will recognize that the strip 105 can be molded in any length with any number of segments. This feature of the strip 105 permits it to be reduced to any length depending on circuit requirements. Also, each section 105 can then be placed in an opposite orientation should a large part need to be placed on both sides of a heat transfer device 150 mounted thereon.

One embodiment of a method to manufacture the heat sink mounting apparatus 100 described herein, is by an injection molding process. When formed by such process, the mounting apparatus 100 can be made in any desired length and can incorporate any number or variation of the various embodiments claimed herein. The actual method of manufacturing the mounting apparatus 100 is clear from the foregoing detailed description and illustrations.

Although the present invention has been described in detail, those skilled in the art should understand that they can make various changes, substitutions and alterations herein without departing from the spirit and scope of the invention in its broadest form.

What is claimed is:

1. For use in coupling an electronic component substrate to a thermal transfer device having a mounting receptacle, a heat sink mounting apparatus, comprising:
 a dielectric strip having a longitudinal axis and opposing first and second sides, said second side abutting said substrate when said heat sink mounting apparatus is mounted on said substrate;
 a series of resilient planar fingers disposed on and extending approximately normal to said first side of said strip, at least one of said fingers configured to removably engage said mounting receptacle of said thermal transfer device; and notches on said fingers to releasably secure said thermal transfer device to said heat sink mounting apparatus.

2. The apparatus as recited in claim 1 wherein a resilient latch finger is disposed on said second side, said latch finger extending approximately normal from said second side and configured to releasably secure said device to said substrate.

3. The apparatus as recited in claim 2 wherein a pair of said latch fingers are disposed on said second side and configured to cooperatively secure said device to said substrate.

4. The apparatus as recited in claim 1 further comprising a guide receptacle on said dielectric strip configured to direct electrical leads of an electronic component mounted on said thermal transfer device to corresponding electrical connections on said substrate.

5. The apparatus as recited in claim 4 wherein said guide receptacle is separately provided for each of said electrical leads.

6. The apparatus as recited in claim 4 wherein a break-a-way is inscribed on said dielectric strip, circumscribing said guide receptacle to permit the removal of said guide receptacle.

7. The apparatus as recited in claim 1 wherein an orifice is provided on said device to receive a fastener to secure said device to said substrate.

8. A method of manufacturing a heat sink mounting apparatus for use in coupling an electronic component substrate to a thermal transfer device having a mounting receptacle, comprising:

forming a dielectric strip having a longitudinal axis and opposing first and second sides, said second side to abut said substrate when said heat sink mounting apparatus is mounted on said substrate;

forming a series of resilient planar fingers disposed on and extending approximately normal to said first side of said strip, at least one of said fingers configured to removably engage said mounting receptacle of said thermal transfer device; and forming notches on said fingers to releasably secure said thermal transfer device to said heat sink mounting apparatus.

9. The apparatus as recited in claim 8 wherein a resilient latch finger is formed on said second side, said latch finger extending approximately normal from said second side and configured to releasably secure said device to said substrate.

10. The apparatus as recited in claim 9 wherein a pair of said latch fingers are formed on said second side, said latch fingers configured to cooperatively secure said device to said substrate.

11. The method as recited in claim 8 further comprising forming a guide receptacle on said dielectric strip, said guide receptacle configured to direct electrical leads of an electronic component mounted on said thermal transfer device to corresponding electrical connections on said substrate.

12. The method as recited in claim 11 wherein said receptacle is formed separately for each of said electrical leads.

13. The method as recited in claim 11 wherein a break-a-way is inscribed on said dielectric strip, circumscribing said guide receptacle to permit the removal of said guide receptacle.

14. The apparatus as recited in claim 8 wherein an orifice is formed on said device to receive a fastener to secure said device to said substrate.

15. An electronic circuit, comprising:

two or more heat generating electronic components couplable to an electronic component substrate;

a heat sink mounting apparatus for mounting a heat transfer device having a mounting receptacle on said electronic component substrate, including;

a dielectric strip having a longitudinal axis and opposing first and second sides, said second side abutting said substrate;

a series of resilient planar fingers disposed on and extending approximately normal to said first side of said strip, at least one of said fingers configured to removably engage said mounting receptacle of said thermal transfer device; and notches on said fingers to releasably secure said thermal transfer device to said heat sink mounting apparatus.

16. The electronic circuit as recited in claim 15 wherein a resilient latch finger is disposed on said second side of said heat sink mounting apparatus, said latch finger extending approximately normal from said second side and configured to releasably secure said heat sink mounting apparatus to said substrate.

17. The electronic circuit as recited in claim 16 wherein a pair of said latch fingers are disposed on said second side and configured to cooperatively secure said heat sink mounting apparatus to said substrate.

18. The electronic circuit as recited in claim 15 further comprising a guide receptacle on said dielectric strip configured to direct electrical leads of an electronic component mounted on said thermal transfer device to corresponding electrical connections on said substrate.

19. The electronic circuit as recited in claim 18 wherein said guide receptacle is separately provided for each of said electrical leads.

20. The electronic circuit as recited in claim 18 wherein a break-a-way is inscribed on said dielectric strip, circumscribing said guide receptacle to permit the removal of said guide receptacle.

21. The electronic circuit as recited in claim 15 wherein an orifice is provided on said dielectric strip to receive a fastener to secure said dielectric strip to said substrate.

* * * * *